(12) United States Patent
Reinmuth et al.

(10) Patent No.: US 9,159,619 B2
(45) Date of Patent: Oct. 13, 2015

(54) METHOD FOR PRODUCING AN ELECTRICAL FEEDTHROUGH IN A SUBSTRATE, AND SUBSTRATE HAVING AN ELECTRICAL FEEDTHROUGH

(71) Applicants: Jochen Reinmuth, Reutlingen (DE); Matthias Neubauer, Reutlingen-Degerschlacht (DE); Martin Lindemann, Reutlingen (DE); Eduard Rije, Duesseldorf (DE); Michael Baumann, Engstingen (DE)

(72) Inventors: Jochen Reinmuth, Reutlingen (DE); Matthias Neubauer, Reutlingen-Degerschlacht (DE); Martin Lindemann, Reutlingen (DE); Eduard Rije, Duesseldorf (DE); Michael Baumann, Engstingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 126 days.

(21) Appl. No.: 14/065,695

(22) Filed: Oct. 29, 2013

(65) Prior Publication Data

US 2014/0131888 A1    May 15, 2014

(30) Foreign Application Priority Data

Oct. 29, 2012 (DE) .......................... 10 2012 219 769

(51) Int. Cl.
| | |
|---|---|
| *H01L 21/00* | (2006.01) |
| *H01L 21/44* | (2006.01) |
| *H01L 21/768* | (2006.01) |
| *H01L 23/48* | (2006.01) |
| *B81C 1/00* | (2006.01) |

(52) U.S. Cl.
CPC ...... *H01L 21/76898* (2013.01); *B81C 1/00095* (2013.01); *H01L 23/481* (2013.01); *H01L 21/7682* (2013.01); *H01L 2224/13* (2013.01); *H01L 2924/1461* (2013.01)

(58) Field of Classification Search
CPC .................. H01L 23/481; H01L 21/76898
USPC .............. 438/50, 51, 53, 667, 669, 672, 675, 438/700; 257/774, E21.585, E21.597
See application file for complete search history.

(56) References Cited

U.S. PATENT DOCUMENTS

| | | | | |
|---|---|---|---|---|
| 2007/0134819 | A1* | 6/2007 | Uchiyama | 438/3 |
| 2009/0026561 | A1* | 1/2009 | Reichenbach et al. | 257/416 |
| 2010/0264548 | A1* | 10/2010 | Sanders et al. | 257/774 |
| 2010/0297844 | A1* | 11/2010 | Yelehanka et al. | 438/667 |
| 2011/0314922 | A1* | 12/2011 | Ismail et al. | 73/718 |
| 2012/0248581 | A1* | 10/2012 | Sugiyama et al. | 257/622 |
| 2012/0258594 | A1* | 10/2012 | Barth et al. | 438/667 |

FOREIGN PATENT DOCUMENTS

DE    10 2010 039330    2/2012

* cited by examiner

*Primary Examiner* — Nitin Parekh
(74) *Attorney, Agent, or Firm* — Kenyon & Kenyon LLP

(57) ABSTRACT

A method for producing an electrical feedthrough in a substrate having an electrical feedthrough, including: forming an etch stop layer on the front side of the substrate; forming a mask on the back side of the substrate; forming an annular trench in the substrate, which trench extends from the back to the front side, by an etching process that stops at the etch stop layer, using the mask, the trench surrounding a substrate punch; depositing a metal layer over the back side of the substrate using the mask, the metal layer penetrating into the annular trench and being deposited on the substrate punch; forming a metal silicide layer on the substrate punch by at least partially converting the metal layer into the metal silicide layer on the substrate punch; selectively removing a remainder of the metal layer; and closing off the annular trench at the back side of the substrate.

10 Claims, 15 Drawing Sheets

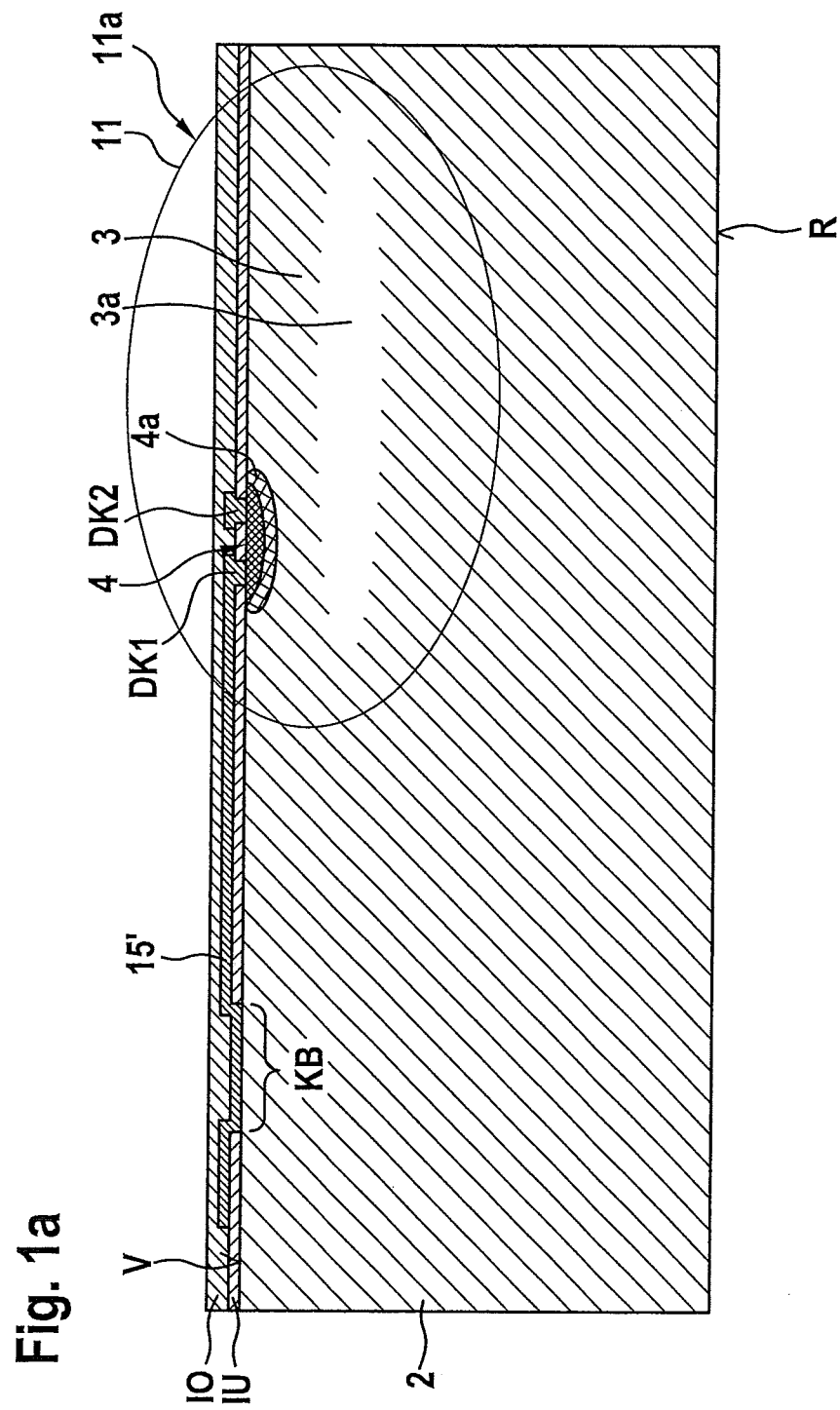

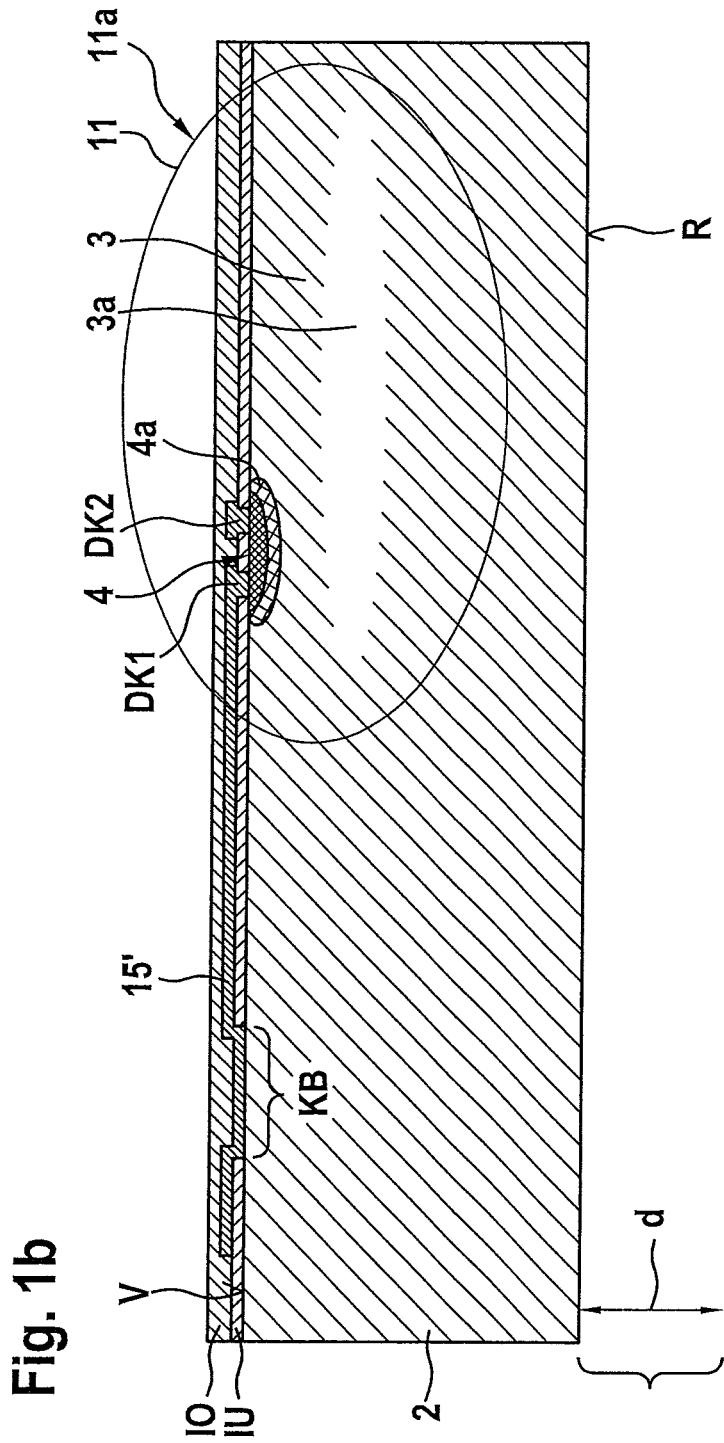

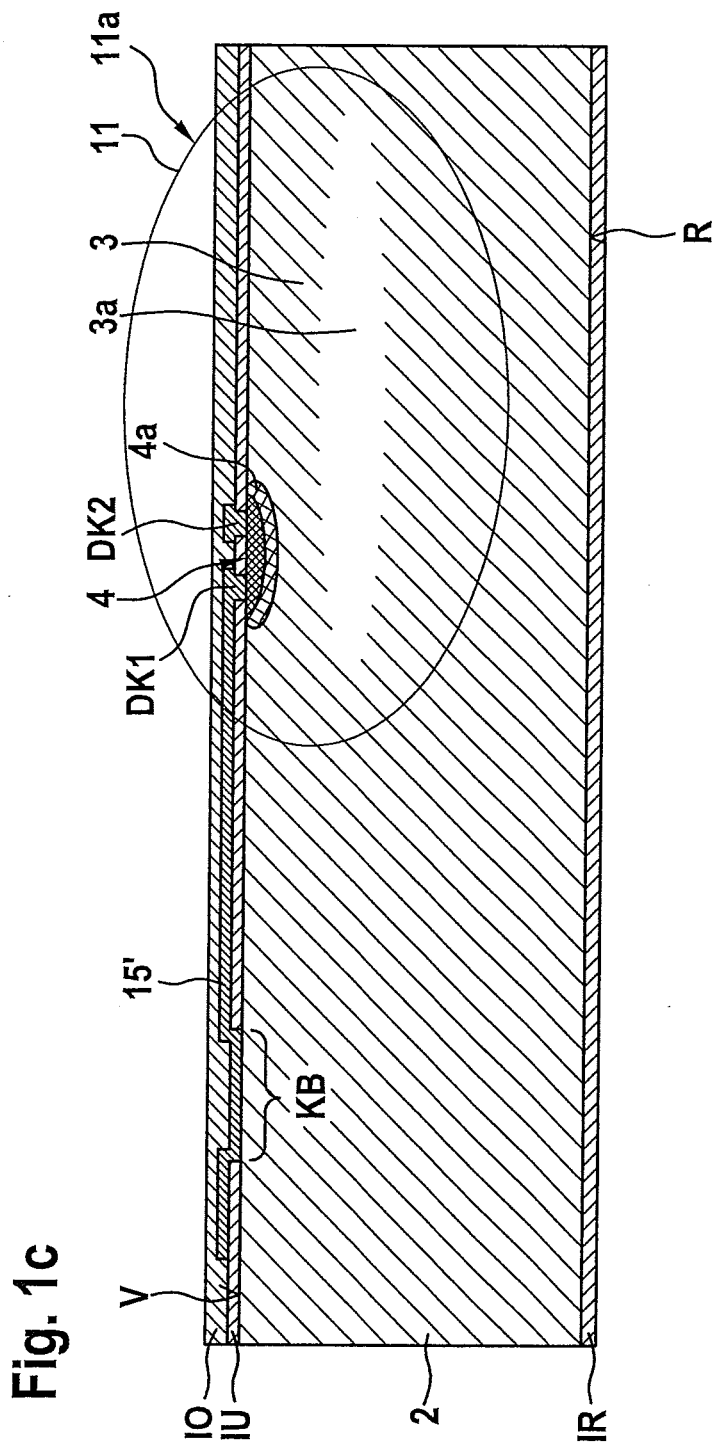

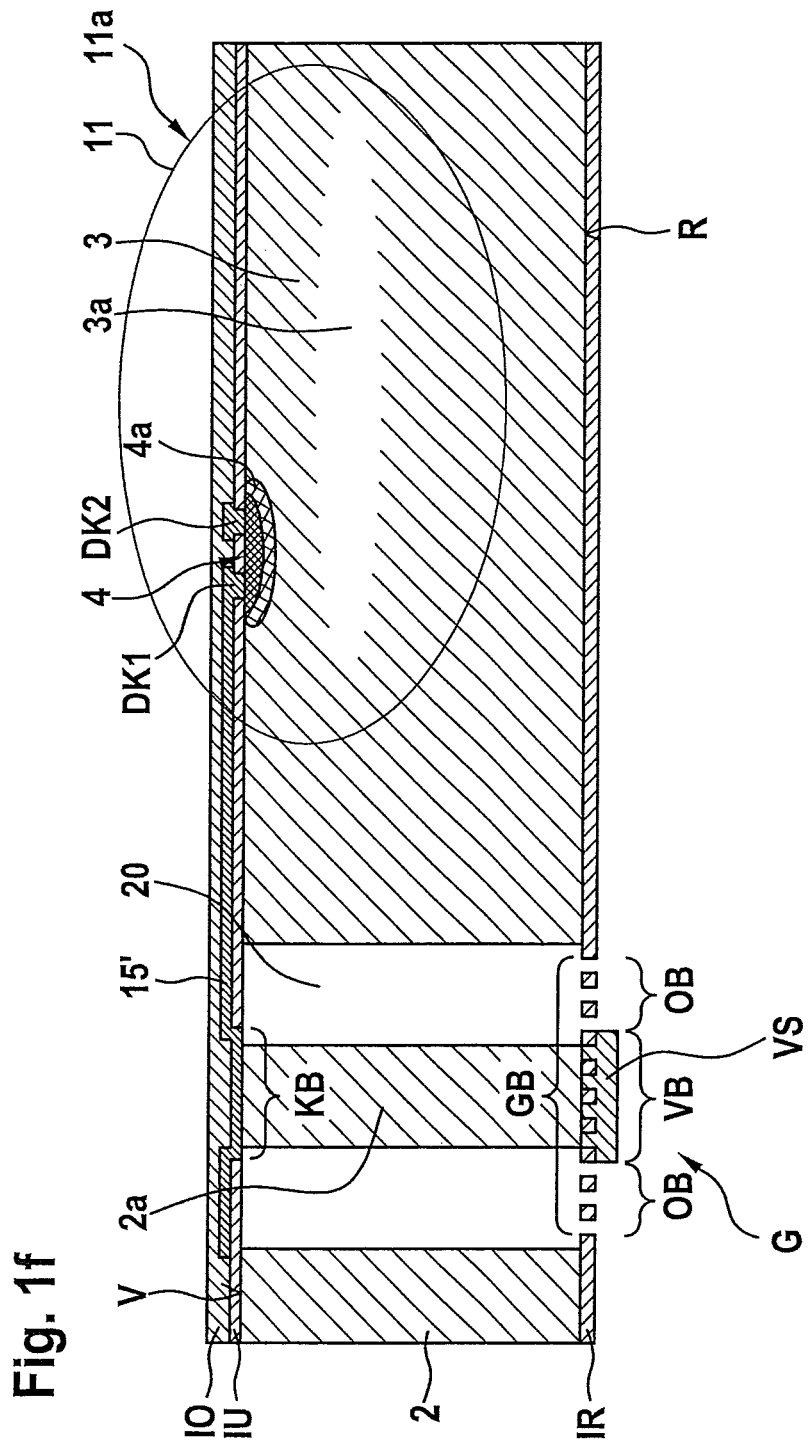

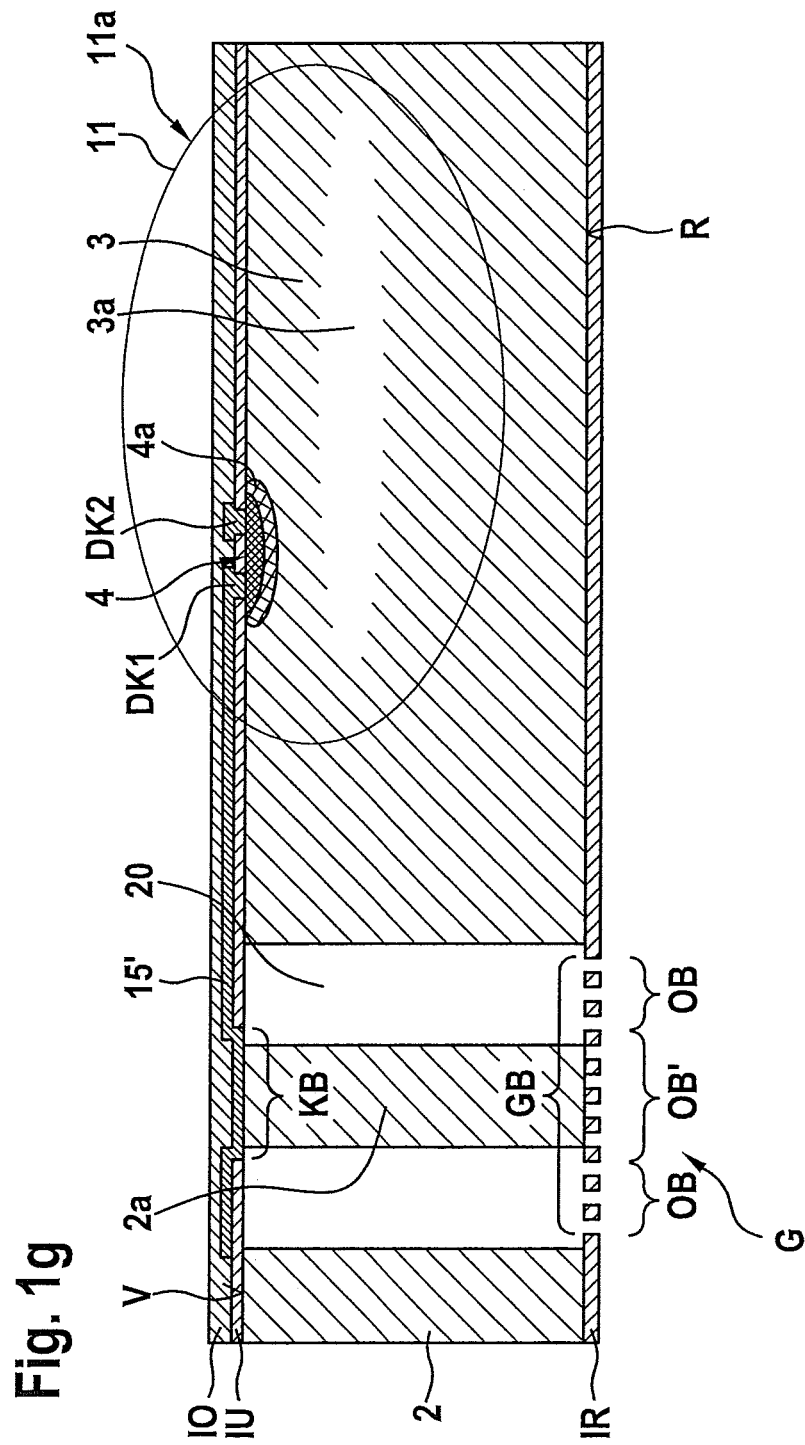

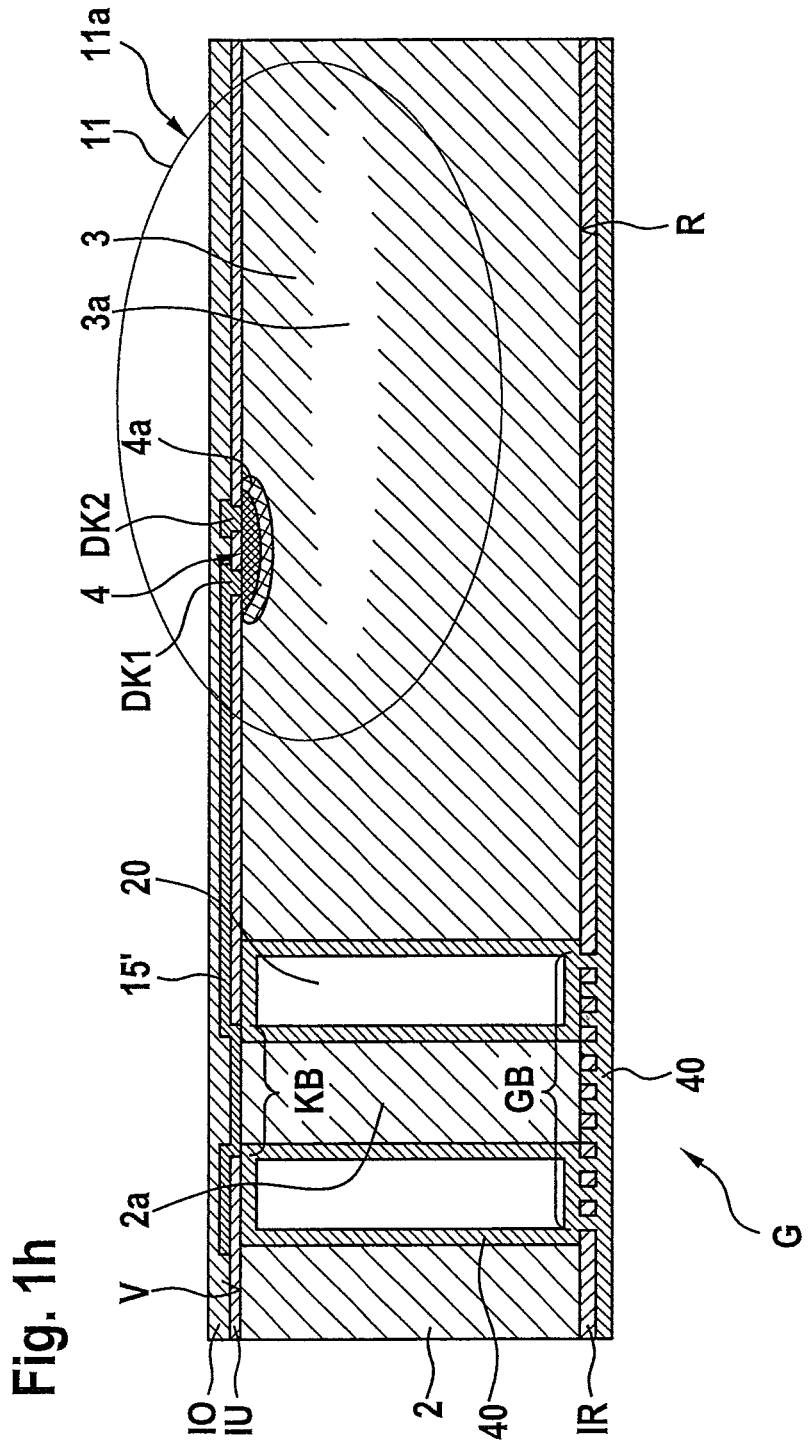

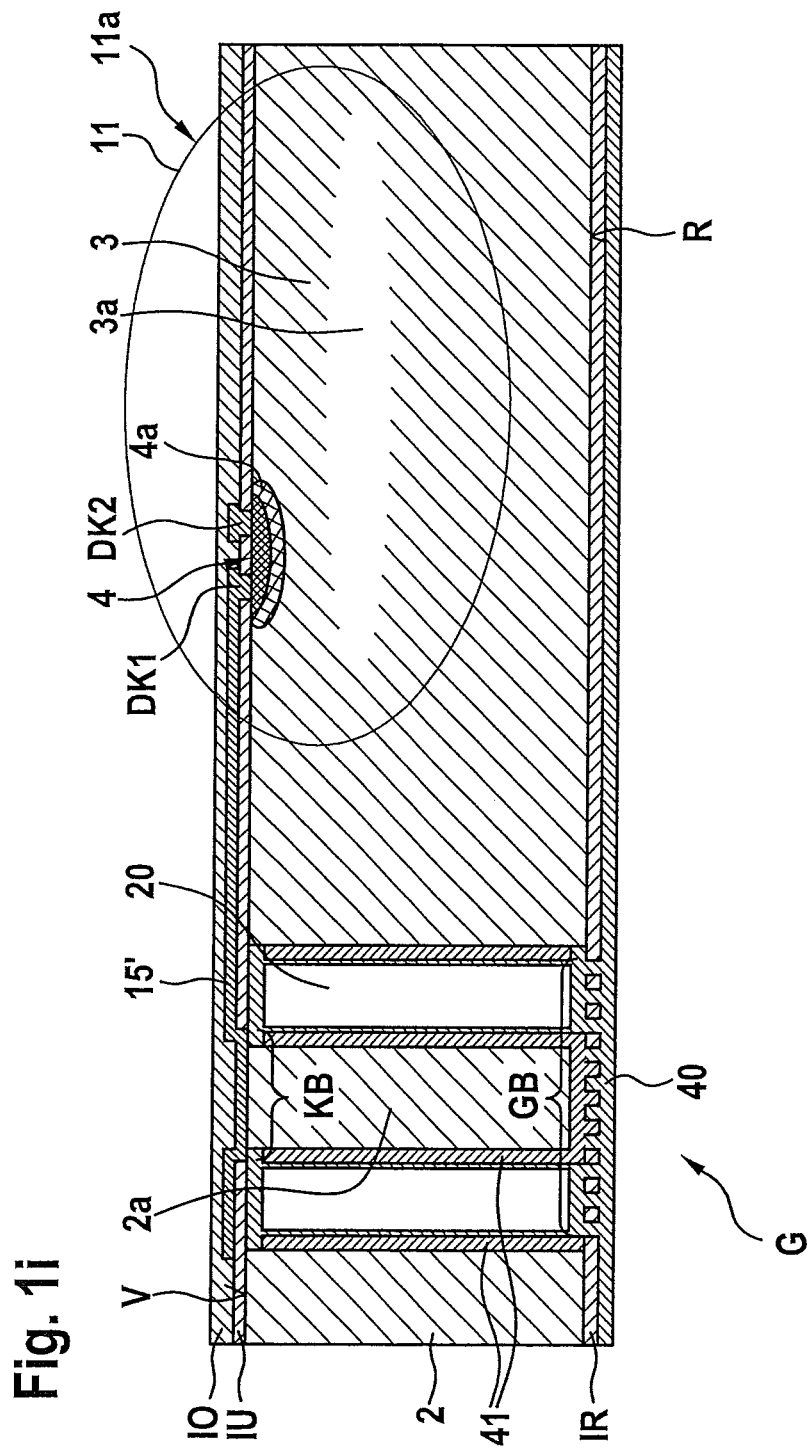

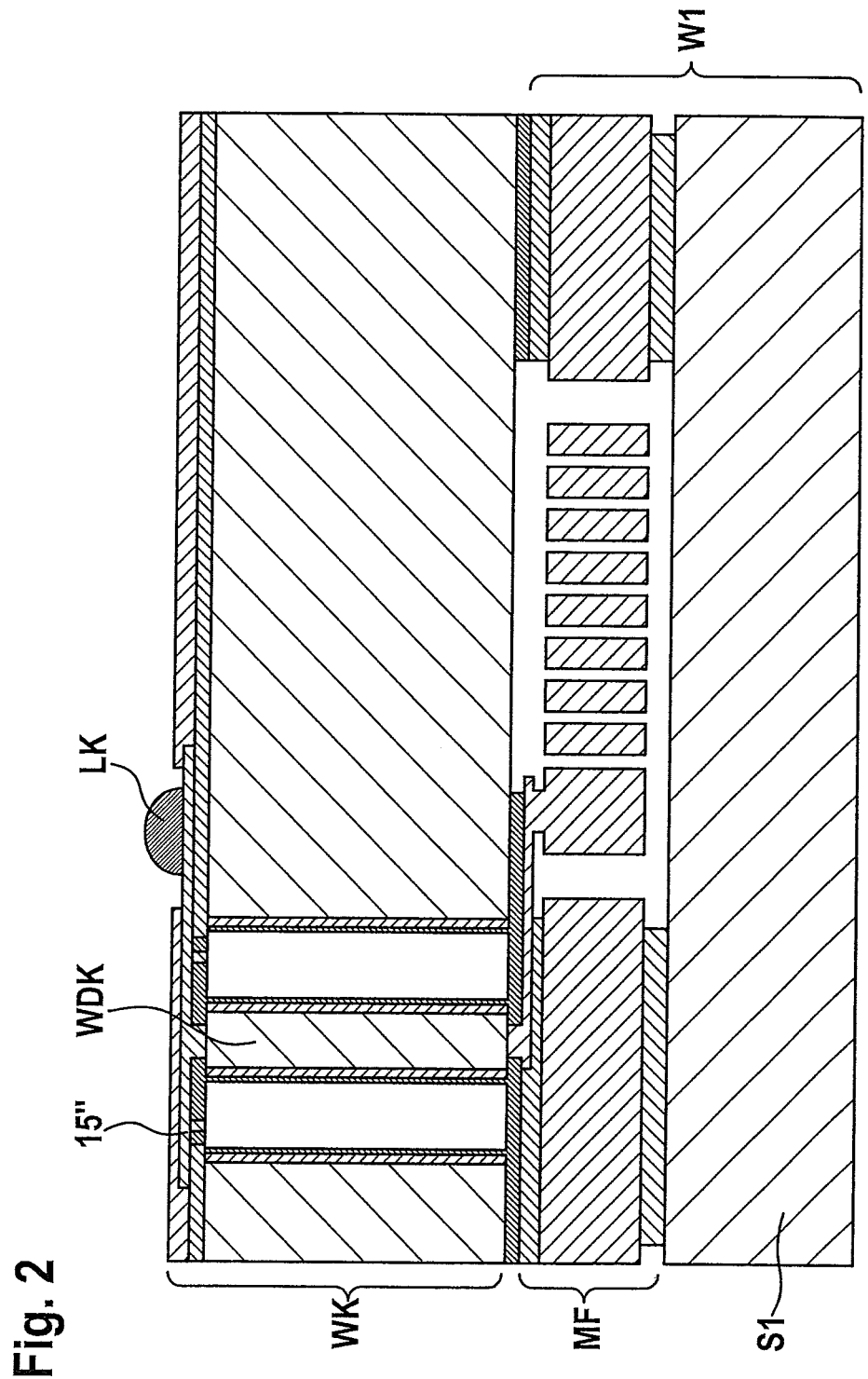

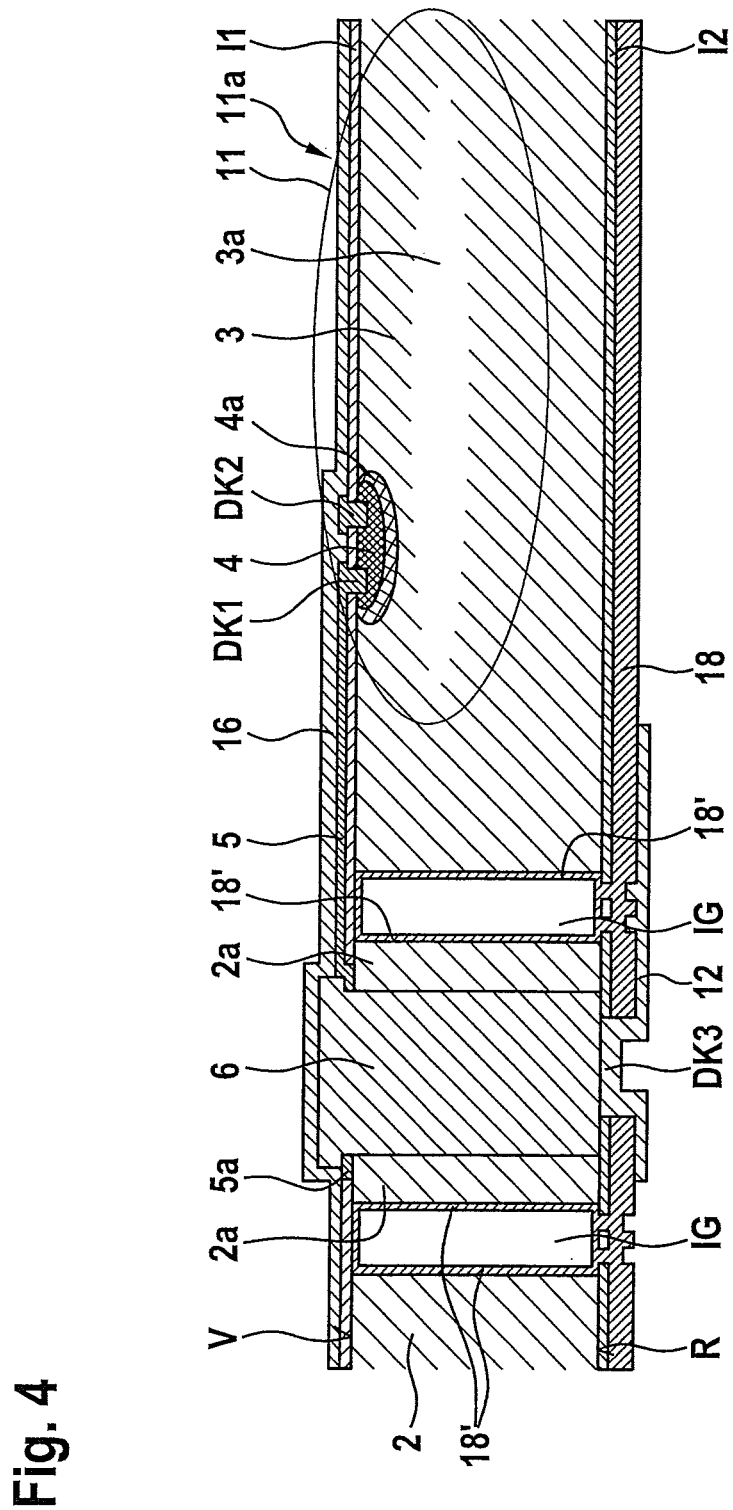

METHOD FOR PRODUCING AN ELECTRICAL FEEDTHROUGH IN A SUBSTRATE, AND SUBSTRATE HAVING AN ELECTRICAL FEEDTHROUGH

RELATED APPLICATION INFORMATION

The present application claims priority to and the benefit of German patent application no. 10 2012 219 769.9, which was filed in Germany on Oct. 29, 2012, the disclosure of which is incorporated herein by reference.

FIELD OF THE INVENTION

The present invention relates to a method for producing an electrical feedthrough in a substrate, and to a substrate having an electrical feedthrough.

BACKGROUND INFORMATION

Electrical feedthroughs in a substrate or in a subarea of a substrate, such as a wafer, for example, exist in a wide variety of embodiments. The aim is always to achieve as small as possible a feedthrough at a low electrical volume resistance. To achieve that, frequently a narrow through-hole with almost vertical walls is produced in the substrate concerned, the wall is electrically insulated, and then the through-hole is completely or partially filled with a metal or a metal alloy in order to obtain the desired low volume resistance.

Depending on the application, that known approach is subject to limitations. On the one hand, there are applications in which the presence of metal produces interference. As an example of numerous MEMS applications, the micromechanical pressure sensor may be mentioned here.

FIG. 3 shows a schematic cross-sectional illustration to explain the set of problems underlying the present invention, with reference to an example of a substrate having an electrical feedthrough and a pressure sensor.

In FIG. 3, reference numeral 2 denotes a silicon semiconductor substrate. A first region 1 having an electrical feedthrough 6a and a second region 11 having a micromechanical component in the form of a pressure sensor are provided in silicon semiconductor substrate 2. Feedthrough 6a is connected to a first electrical contact terminal DK1 of pressure sensor 11a via a strip conductor 15a on front side V of substrate 2. Pressure sensor 11 has a diaphragm 3 which is provided over a cavity 3a. A piezoresistive resistor 4 and an isolation well 4a situated therebeneath are diffused into diaphragm 3. First electrical contact terminal DK1 and, in addition, a second electrical contact terminal DK2 contact piezoresistive resistor 4 in such a way that the piezoelectric resistance is detectable between them.

A first insulating layer I1 is provided between electrical metal strip conductor 15a and front side V of substrate 2. A second insulating layer I2 is provided between a back-side electrical metal strip conductor 15b and back side R of substrate 2. Insulating layers I1 and I2 may, for example, be oxide layers. Feedthrough 6a connects front-side strip conductor 15a to back-side strip conductor 15b. A wall insulating layer 7a, which is likewise made of oxide, for example, isolates feedthrough 6a from surrounding substrate 2. Lastly, reference numeral 9 denotes what is referred to as a seed layer for applying the metal of feedthrough 6a, which at the same time may be used as a diffusion barrier.

In such classical micromechanical pressure sensors 11, deformation of silicon diaphragm 3, which is disposed on silicon substrate 2, is measured by way of the piezoresistive resistance. When the pressure changes, the deformation of diaphragm 3, and hence the resistance signal of piezoresistive resistor 4, changes. Owing to the differing material parameters of silicon and metal, even the narrow metal strip conductors 15a situated on the surface and in the vicinity of diaphragm 3 cause voltages which are transmitted via substrate 2 to diaphragm 3. It is possible with some effort to compensate for the temperature-dependent component of the voltages. However, the inelastic properties of many metals also cause hysteresis in the characteristic curve of the pressure sensor. It is not possible to compensate for that effect. When metallic regions are provided not only at the surface but also at a depth within substrate 2, distinctly greater adverse effects on voltage-sensitive components, such as pressure sensors, for example, are also expected.

On the other hand, there are a number of applications in which primarily also high voltages or also only high voltage peaks (ESD, for example) are to be conducted through a substrate or a subarea of the substrate via an electrical feedthrough. This proves to be difficult with the approach described above. Isolation of the etched through-holes is usually achieved by oxide deposition. The achievable oxide thicknesses are greatly limited by the process control and the specific geometry. Accordingly, the maximum dielectric strength is also greatly limited. In addition, the surface of the through-holes, which is formed using a trench etching process or a laser process, is rather rough. That roughness causes electric field peaks which likewise reduce the dielectric strength.

Alternative approaches that manage without metals are not usable in many applications, since only with metals is it possible to achieve the extremely low volume resistances that are often necessary.

FIG. 4 shows a schematic cross-sectional illustration to explain the set of problems underlying the present invention, with reference to a substrate having an electrical feedthrough and a pressure sensor as known from German patent document DE 10 2010 039 330 A1.

Substrate 2 shown in FIG. 4 has an electrical feedthrough 6 running through substrate 2 from its front side V to its back side R. An annular isolation trench IG in substrate 2 surrounds electrical feedthrough 6 and is closed off by first insulating layer I1 on front side (V) and by second insulating layer I2 and a closing layer 18 on back side R of substrate 2. A thin liner-shaped insulating layer 18' is formed on the walls of annular isolation trench IG. Annular isolation trench IG may be filled or unfilled (as illustrated). An annular substrate region 2a surrounds electrical feedthrough 6. A contact terminal DK3 to electrical feedthrough 6 is formed on back side R of substrate 2. An electrical strip conductor 5 is formed on front side V of substrate 2 between a contact ring 5a, situated on electrical feedthrough 6, and pressure sensor 11a. Thereover, a dielectric protection layer 16, for example made of nitride, is formed.

The subject matter of German Patent document DE 10 2010 039 330 permits the production of metallic feedthroughs through a substrate, with a high dielectric strength and voltage decoupling between the metalized region and the substrate being possible.

The method from German patent document DE 10 2010 039 330 is, however, relatively laborious and expensive. In addition, the combination disclosed therein of metallic punch and separate isolation ring permits only relatively large feedthroughs to be produced.

SUMMARY OF THE INVENTION

The present invention provides a method for producing an electrical feedthrough in a substrate, having the features described herein, and a substrate with an electrical feedthrough, having the features described herein.

By virtue of the present invention, a feedthrough and a corresponding production method are made available which make it possible to form, instead of a metallic feedthrough, a feedthrough that makes use of a low-resistance metal silicide layer which may be produced in a simple manner on a trenched substrate punch. The feedthrough according to the invention saves on space and at the same time has a low resistance, a high dielectric strength and also low parasitic capacitances.

An aspect of the present invention resides in the formation of a substrate punch in the substrate, which substrate punch is isolated by an annular trench and onto which a metal layer is conformally deposited. At the interface between metal layer and silicon of the silicon semiconductor substrate, a metal silicide layer is formed by a temperature step or another type of activation. Thereafter, the excess metal is selectively removed to the silicide layer. The resulting silicon punch with the surface metal silicide layer serves as a low-resistance feedthrough. The annular region which is trenched to form the punch serves as insulation since, at the base of the annulus and at the upper side of the annulus, the pre-product (metal layer) of the silicide layer may be removed relative to the silicide layer and nor is any silicide able to form in that region.

The resulting substrate punch coated with the metal silicide layer may be connected to one or more components at the front side and at the back side in a simple manner via electrical strip conductors.

The main advantages of that type of feedthrough reside in high dielectric strength, low leakage currents, low parasitic capacitances, low electrical resistance, and in the independence of the resistance of the feedthrough and the substrate doping. In particular, very small feedthroughs having high aspect ratios may be obtained, it also being possible to obtain the feedthroughs in very thick substrates and especially to form feedthroughs having a planar surface.

Further developments form the subject matter of the respective further embodiments described herein.

Further features and advantages of the present invention are described below with the aid of embodiments and with reference to the Figures.

BRIEF DESCRIPTION OF THE DRAWINGS

FIGS. 1a to 1l show schematic cross-sectional illustrations to explain various process stages of a method for producing an electrical feedthrough in a substrate according to a first embodiment of the present invention.

FIG. 2 shows a schematic cross-sectional illustration of a substrate with an electrical feedthrough in use for encapsulation of a MEMS wafer according to a second embodiment of the present invention.

FIG. 4 shows a schematic cross-sectional illustration to explain the set of problems underlying the present invention, with reference to a substrate having an electrical feedthrough and a pressure sensor as in German patent document DE 10 2010 039 330 A1.

DETAILED DESCRIPTION

In the Figures, identical or functionally identical components are denoted by the same reference symbols.

FIGS. 1a to 1l show schematic cross-sectional illustrations to explain various process stages of a method for producing an electrical feedthrough in a substrate according to a first embodiment of the present invention.

Figure 3:
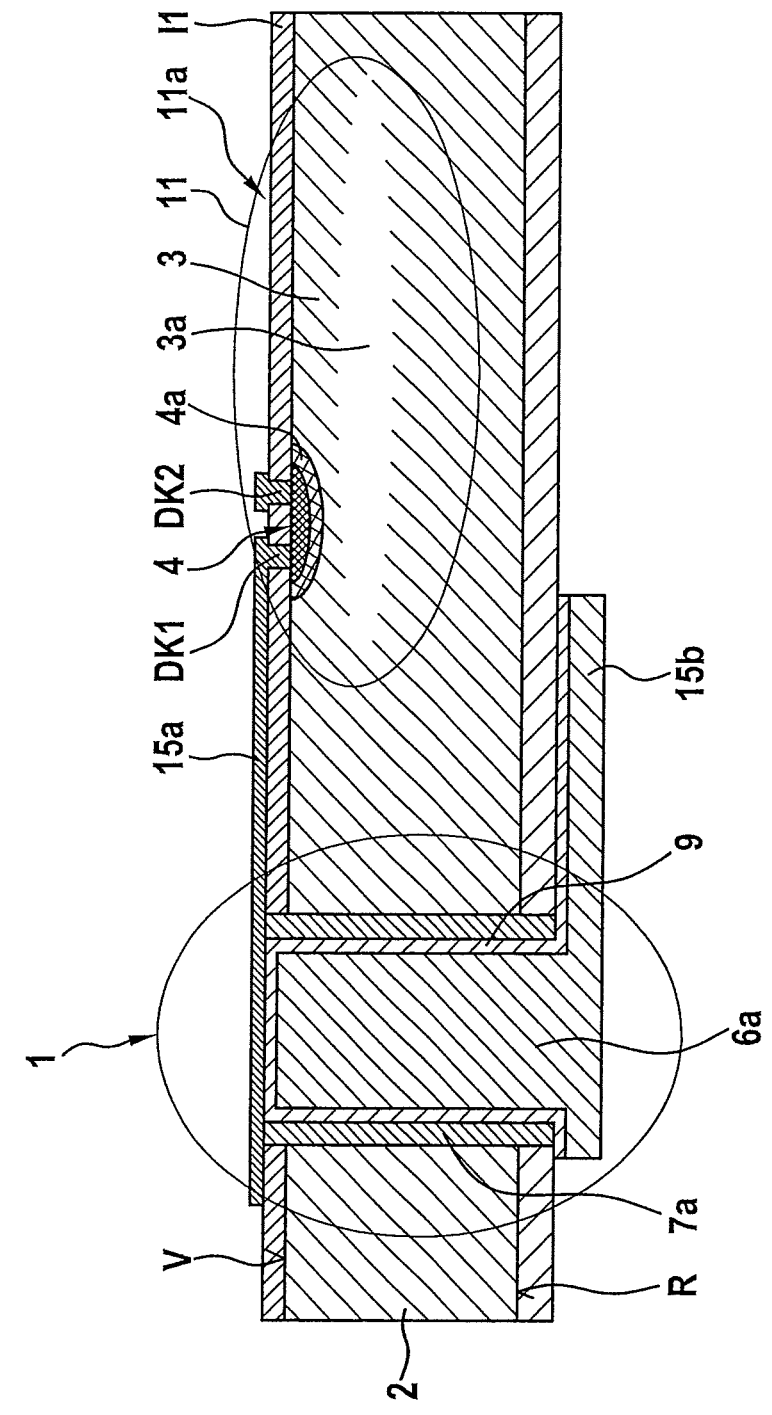
FIG. 3 shows a schematic cross-sectional illustration to explain the set of problems underlying the present invention, with reference to an example of a substrate having an electrical feedthrough and a pressure sensor.

As shown in FIG. 1a, a micromechanical component 11a in the form of a pressure sensor, which has already been explained in detail with reference to FIG. 3, is provided in a silicon semiconductor substrate 2.

Reference symbol IU denotes a lower insulating layer, for example made of oxide or nitride, on front side V of silicon semiconductor substrate 2, on which insulating layer a strip conductor 15' is formed which electrically contacts silicon semiconductor substrate 2 in a step-shaped manner in a contact region KB. In addition, electrical strip conductor 15' is connected to electrical contact terminal DK1 of pressure sensor 11a.

Above lower insulating layer IU and electrical strip conductor 15' there is an upper insulating layer IO, for example likewise made of oxide or nitride, which constitutes a front-side passivation.

To form electrical strip conductor 15', one or more metal layer(s) may be deposited with or without diffusion barriers or adhesive layers. A W or Cu or Al metal layer with a Ti/TiN or TaN/Ta barrier may be used. After the deposition, appropriate patterning is carried out in a photolithographic process.

Further, with reference to FIG. 1b, silicon semiconductor substrate 2 may be ground on back side R to reduce the thickness of silicon semiconductor substrate 2 by a differential thickness d which is based, for example, on the height of the feedthrough that is to be formed. Back side R may in that case be conditioned using a back-etch process in a plasma process or in a liquid etching medium or in a CMP process.

As shown in FIG. 1c, a back-side insulating layer IR is then applied to back side R, for example an oxide layer.

Figure 1D:
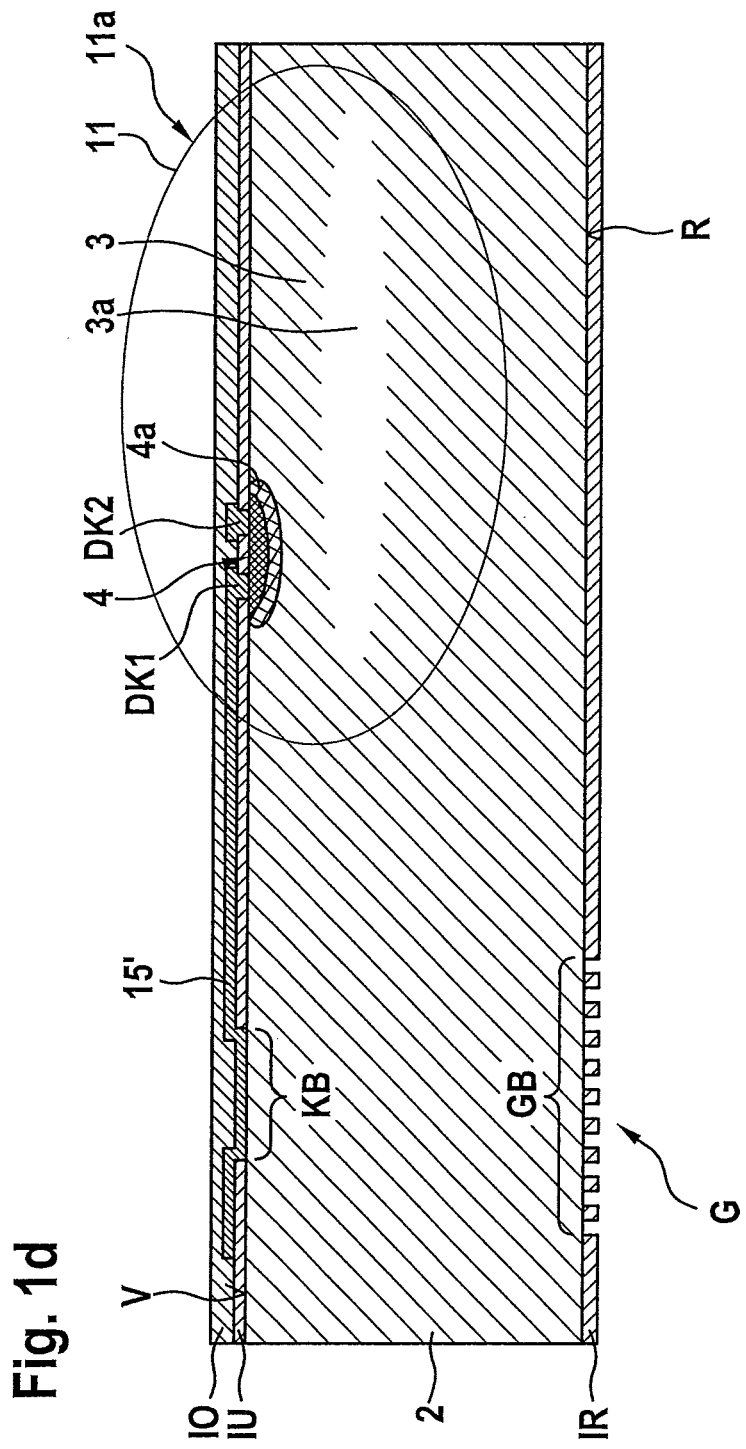

In a process step that then follows, which is illustrated in FIG. 1d, a fine grid G is then patterned into back-side insulating layer IR in a grid region GB, grid region GB lying opposite contact region KB on front side V. Grid region GB therefore lies in the region in which a trench for the feedthrough is subsequently to be created. In grid region GB, back side R of silicon semiconductor substrate 2 is laid bare.

Figure 1E:
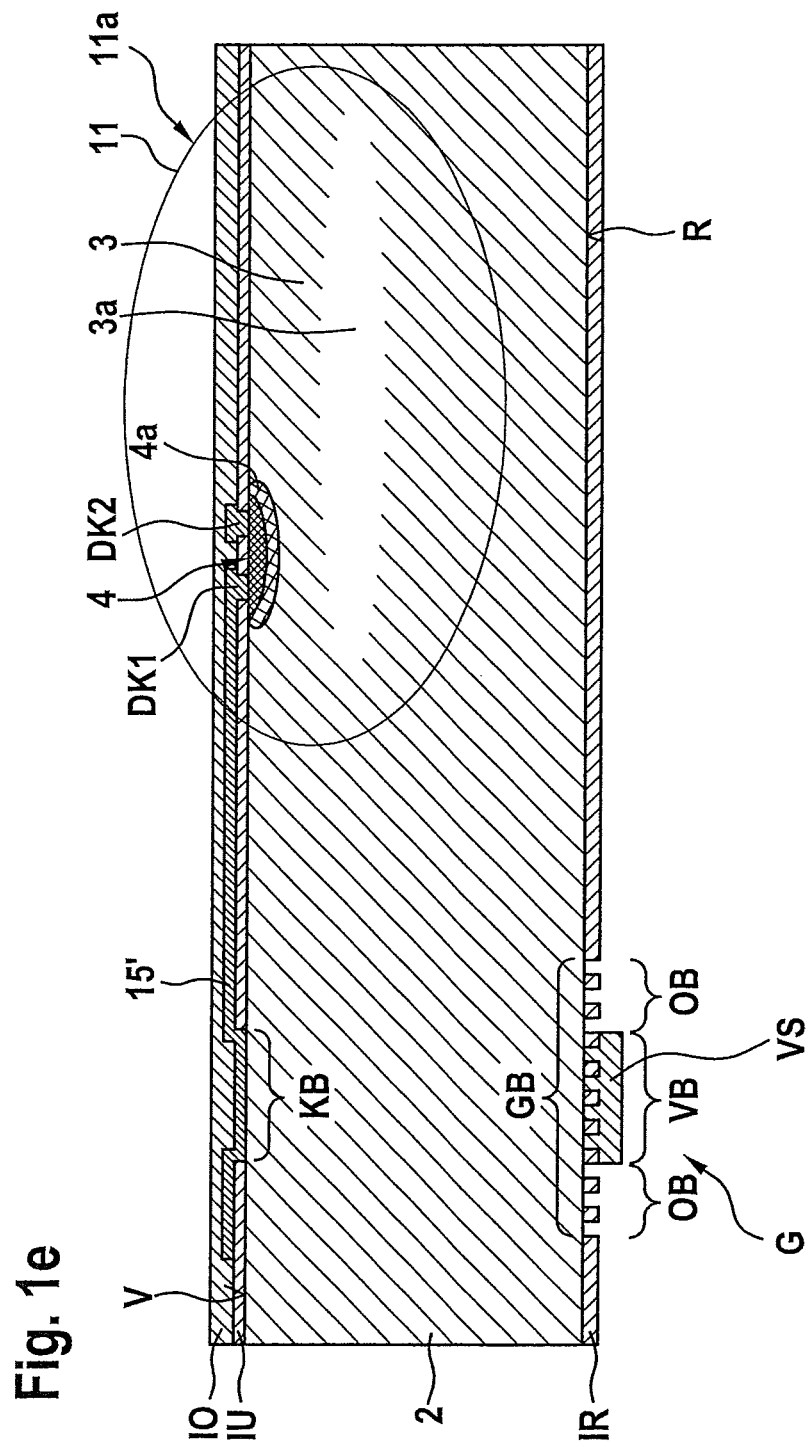

At the center of grid G opposite contact region KB, grid G is then closed off in a closing region VB, an annular open region OB surrounding closing region VB. An appropriate plug of a closing layer VS may be formed, for example, from photoresist which may later be selectively removed. This is illustrated in FIG. 1e.

Further, with reference to FIG. 1f, silicon semiconductor substrate 2 is trenched higher from back side R in order to form an annular trench 20 in silicon semiconductor substrate 2, which trench 20 extends from back side R to front side V. The process parameters are chosen here in such a way that the silicon of silicon semiconductor substrate 2 is completely removed under open region OB of grid region GB, where applicable with additional lateral under-etching. The etching process stops at lower insulating layer IU on front side V of the substrate and in a specific variant, as shown, also partly at electrical strip conductor 15'. In that manner, a low resistance of the feedthrough may be achieved in the further course of the process, since electrical strip conductor 15' may be connected directly to the metal silicide layer that is to be formed in the subsequent course of the process.

As shown in FIG. 1g, the plug made of resist of closing layer VS, which plug forms closing region VB, is subsequently selectively removed to back-side insulating layer IR over silicon substrate punch 2a situated at the center of annular trench 20.

Then, as shown in FIG. 1h, a metal layer 40 is deposited over back side R in a conformal deposition process, metal layer 40 being deposited also in annular trench 20 on the surface of silicon semiconductor substrate 2 and on lower insulating layer IU and strip conductor 15' on front side V. Grid region GB may also be closed again in the process. A grid region GB that is still open is equally possible.

Suitable metals are, for example, Ti, Ni, Co, Pt or W, which are able to form low-resistance silicide phases with silicon with low activation energy. The deposition may be carried out in a simple sputtering process. In the case of high aspect ratios, which may be conformal depositions, such as, for example, an MOCVD deposition (metallo-organic chemical vacuum deposition) or an ALD deposition (atomic layer deposition), are used.

As shown in FIG. 1i, in the process of deposition of metal layer 40 or subsequently by a separate process step (for example oven, RTP, laser anneal), a thermal silicide reaction is activated between metal layer 40 and the regions covered by metal layer 40 in annular trench 20 of silicon semiconductor substrate 2, which leads to the formation of a metal silicide layer 41 on the walls of annular trench 20 and on the underside of substrate punch 2a. In particular, metal silicide layer 41 is also in electrical contact with front-side strip conductor 15'.

Figure 1J:
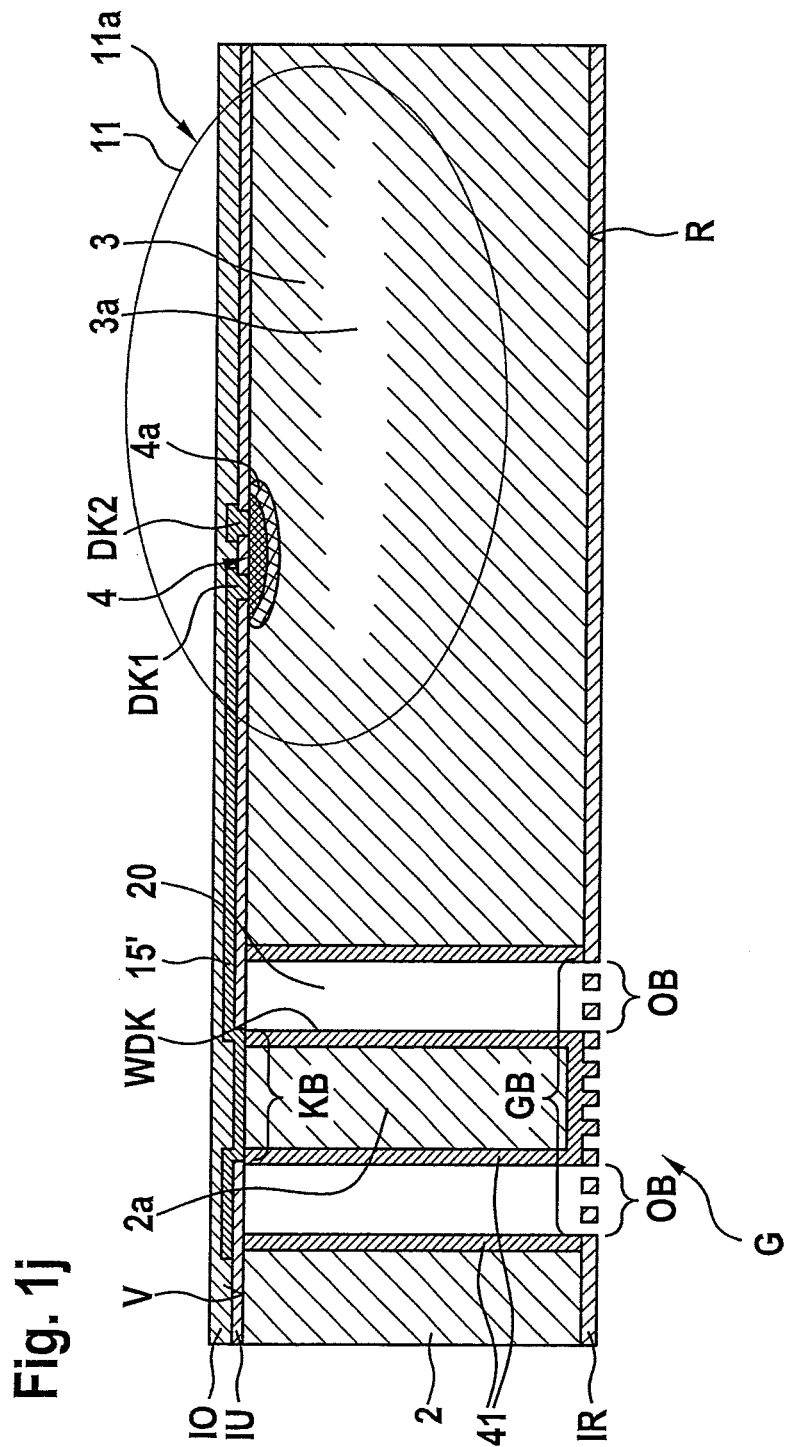

Then, as illustrated in FIG. 1j, the excess metal of metal layer 40 and the metal of metal layer 40 that has not been deposited on back-side insulating layer IR of silicon semiconductor substrate 2 is selectively removed to metal silicide layer 41.

A wet-chemical process using $H_2SO_4$ may be used for that purpose. Particularly on lower insulating layer IU and front-side electrical strip conductor 15', the excess metal of metal layer 40 is completely removed again in that operation, so that isolation from the surrounding substrate 2 is ensured.

Substrate punch 2a, coated with metal silicide layer 41, of silicon semiconductor substrate 2 is therefore linked on front side V of silicon semiconductor substrate 2 via electrical strip conductor 15' to micromechanical component 11a in the form of the pressure sensor. It will be appreciated that linking to further components also may be carried out by providing further electrical strip conductors (not shown). An electrical feedthrough WDK is thus created.

Figure 1K:
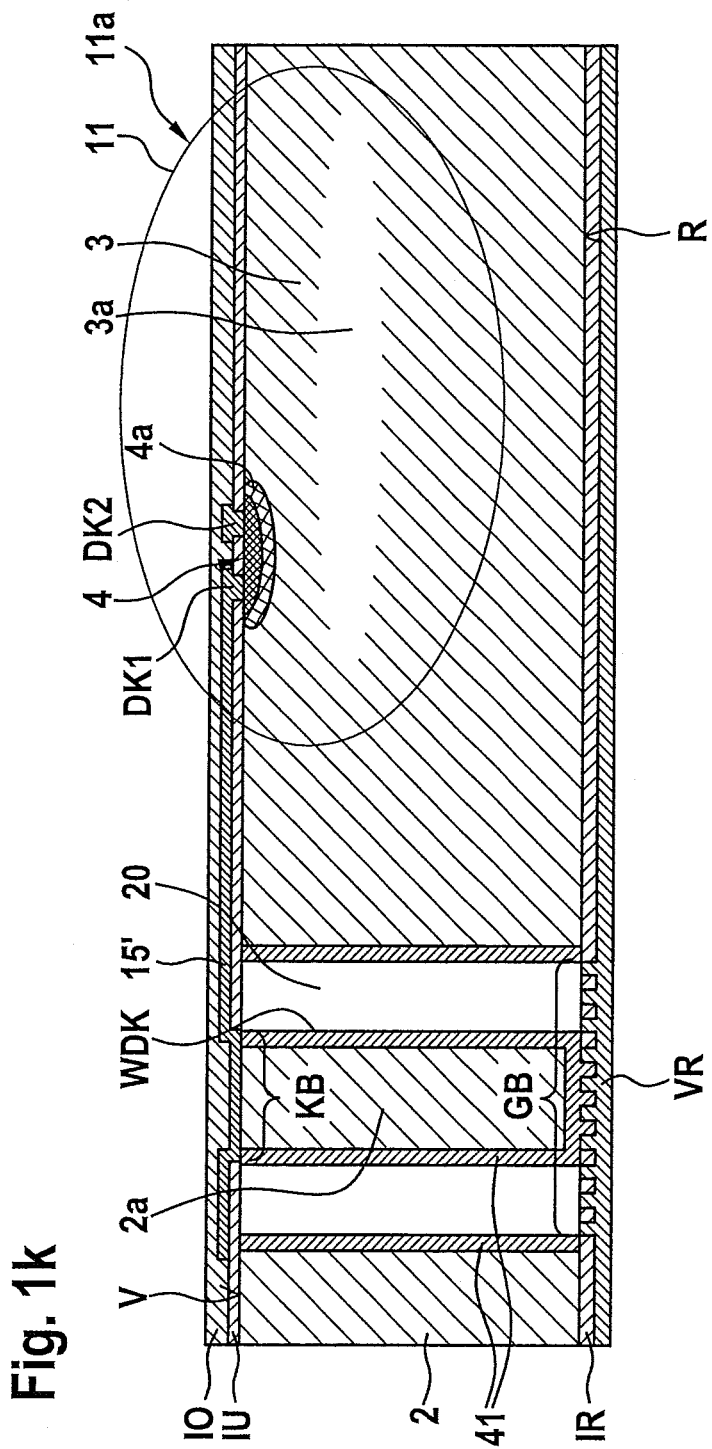

As illustrated in FIG. 1k, grid G is then closed off by a back-side closing layer VR, for example an oxide layer or a nitride layer.

In one process step (not shown), annular region 20 may be completely or partially filled with a further insulating layer beforehand to offer even better isolation.

Figure 1L:
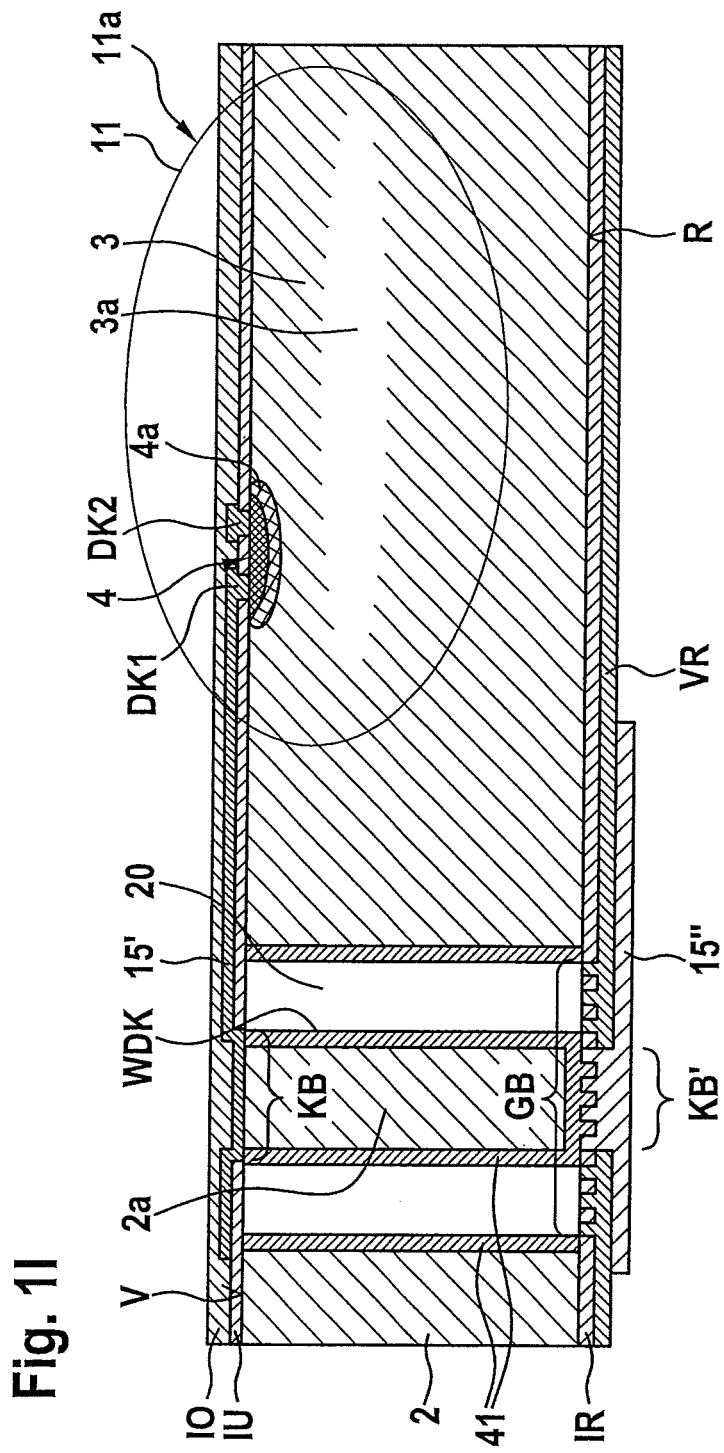

Lastly, with reference to FIG. 1l, a back-side contact region KB' is formed opposite front-side contact region KB, and a back-side contacting of punch 2a coated with metal silicide layer 41 is created by way of a back-side electrical strip conductor 15". The advantage with that arrangement is that, by way of the lower region of metal silicide layer 41, it is possible to create a direct electrical contact to the region of metal silicide layer 41 surrounding substrate punch 2a.

On closing layer VR it is possible to form, by suitable metal deposition and patterning, any desired redistribution layer, for example with connections to further back-side components, FIG. 1l showing, for reasons of simplicity, only back-side electrical strip conductor 15".

Thereafter, it is then possible, for example by applying balls of solder to back-side strip conductor 15", to mount silicon semiconductor substrate 2 with feedthrough WDK on a circuit board or on some other housing using the flip-chip method.

Optionally, still further components or other structures may also be formed on back side R of silicon semiconductor substrate 2 and be connected to feedthrough WDK beforehand.

FIG. 2 shows a schematic cross-sectional illustration of a substrate with an electrical feedthrough in use for encapsulating a MEMS wafer according to a second embodiment of the present invention.

In the case of the embodiment shown in FIG. 2, instead of the single silicon semiconductor substrate 2, a stack of substrates is provided, reference symbol W1 denoting a first substrate with a base wafer S1 and, situated thereon, a micromechanical function layer MF on which a second substrate WK having a feedthrough WDK according to the embodiment is disposed, a small ball of solder LK being provided on a strip conductor 15" on the top side of substrate WK having feedthrough WDK for the purpose of flip-chip bonding. Second substrate WK is bonded onto first substrate W1 as an encapsulation.

Although the present invention has been described with reference to several exemplary embodiments which may be combined with one another as desired, the present invention is not limited thereto but may be further modified in various ways.

In particular, the materials mentioned above are merely examples and are not to be construed as being limiting. In addition, the micromechanical components such as the pressure sensor, the strip conductors, and further electrical components, for example, may be produced in or on the substrate either before or after production of the feedthroughs.

It will be appreciated that any desired additional protective, insulating, passivation and diffusion barrier layers may be deposited to further increase the reliability.

Although substrate punch 2a or feedthrough WDK is shown as being cylindrical in the embodiment illustrated in FIGS. 1a through l, it is possible to depart from cylindrical punch shapes and use rectangular or square punch shapes if especially space-saving yet low-resistance feedthroughs are required. It is also possible to use, for example, star-shaped punch shapes, that is to say, punch shapes that have a large surface in comparison with their volume. Furthermore, it is also possible to adjust any desired resistances even within a chip by way of the shape of the stacks for the feedthroughs.

In many other feedthrough concepts, the resistance may be obtained only through parallel connection of a plurality of feedthroughs not scalable at chip level.

What is claimed is:

1. A method for producing an electrical feedthrough in a substrate having a front side and a back side, the method comprising:
    forming an etch stop layer on the front side of the substrate;
    forming a mask on the back side of the substrate;
    forming an annular trench in the substrate, which trench extends from the back side to the front side, by an etching process using the mask, the etching stops at the etch stop layer, the forming the annular trench surrounding a substrate punch;
    depositing a metal layer over the back side of the substrate using the mask, the metal layer penetrating into the annular trench and being deposited on the substrate punch;
    forming a metal silicide layer on the substrate punch by at least partially converting the metal layer into the metal silicide layer on the substrate punch;
    selectively removing a remainder of the metal layer; and
    closing off the annular trench at the back side of the substrate.

2. The method of claim 1, wherein the forming of the mask includes forming a grid on the back side of the substrate in a grid region, and closing off a central region of the grid to form a closing region corresponding to the substrate punch and to form an annular open region corresponding to the annular trench.

3. The method of claim 2, wherein the closing region is opened before the deposition of the metal layer over the back side of the substrate, so that the metal layer is deposited in the grid region on the substrate punch at the back side of the substrate.

4. The method of claim 1, wherein on the front side of the substrate a first insulating layer is formed as the etch stop layer, wherein on the first insulating layer a first electrical strip conductor is formed which contacts the substrate through the first insulating layer in a first contact region, and wherein the annular trench is formed so that the first contact region is situated on the substrate punch.

5. The method of claim 4, wherein the annular trench is formed so that the contact region extends into the annular trench, and wherein the first electrical strip conductor also acts as the etch stop layer.

6. The method of claim 1, wherein, for closing off the annular trench at the back side of the substrate after the selective removal of the remainder of the metal layer, the mask is closed off by depositing a back-side closing layer.

7. The method of claim 1, wherein the forming of the metal silicide layer is carried out by a thermal process.

8. The method of claim 6, wherein there is formed on the back-side closing layer a second electrical strip conductor which contacts the substrate punch through the back-side closing layer in a second contact region.

9. The method of claim 1, wherein the substrate is made thinner from the back side before the mask is formed.

10. The method of claim 1, wherein the deposition of the metal layer is carried out in one of a sputtering process, an ALD process, and an MOCVD process.

* * * * *